US008698299B2

(12) United States Patent
Ishikawa et al.

(10) Patent No.: US 8,698,299 B2
(45) Date of Patent: *Apr. 15, 2014

(54) SEMICONDUCTOR DEVICE WITH WIRING SUBSTRATE INCLUDING LOWER CONDUCTIVE PADS AND TESTING CONDUCTIVE PADS

(75) Inventors: Toshikazu Ishikawa, Kanagawa (JP); Mikako Okada, Kanagawa (JP)

(73) Assignee: Renesas Electronics Corporation, Kanagawa (JP)

(*) Notice: Subject to any disclaimer, the term of this patent is extended or adjusted under 35 U.S.C. 154(b) by 0 days.

This patent is subject to a terminal disclaimer.

(21) Appl. No.: 13/409,865

(22) Filed: Mar. 1, 2012

(65) Prior Publication Data

US 2012/0153282 A1 Jun. 21, 2012

Related U.S. Application Data

(63) Continuation of application No. 12/203,972, filed on Sep. 4, 2008, now Pat. No. 8,159,058.

(30) Foreign Application Priority Data

Sep. 12, 2007 (JP) ................................. 2007-236594

(51) Int. Cl.
*H01L 23/02* (2006.01)
(52) U.S. Cl.
USPC ........... 257/686; 257/723; 257/777; 257/737; 257/738; 438/109; 438/613; 438/614
(58) Field of Classification Search
USPC ......... 257/777, 778, 686, 723, 685, 690, 734, 257/737, 738, 781, 782, 783, 784, 786, 787, 257/789, 791, 792, 793; 438/106, 108, 109, 438/110, 612, 613, 614, 107, 118, 127

See application file for complete search history.

(56) References Cited

U.S. PATENT DOCUMENTS

| 6,700,208 | B1 | 3/2004 | Yoneda |
| 7,352,052 | B2 | 4/2008 | Imoto et al. |
| 7,489,521 | B2 | 2/2009 | Kariya et al. |
| 7,498,668 | B2 | 3/2009 | Kawabata et al. |
| 7,563,640 | B2 | 7/2009 | Wakisaka et al. |
| 8,159,058 | B2 * | 4/2012 | Ishikawa et al. .............. 257/686 |
| 2003/0042618 | A1 | 3/2003 | Nose et al. |

(Continued)

FOREIGN PATENT DOCUMENTS

| JP | 10-012809 | 1/1998 |
| JP | 2001-127198 A | 5/2001 |

(Continued)

*Primary Examiner* — Thanh Y Tran
(74) *Attorney, Agent, or Firm* — Mattingly & Malur, PC

(57) ABSTRACT

Miniaturization and high-performance of a semiconductor device are promoted, which has a package on package (POP) structure in which a plurality of semiconductor packages is stacked in a multistage manner. A testing conductive pad for determining the quality of a conduction state of a microcomputer chip and a memory chip is arranged outside a conductive pad for external input/output and thereby the route of a wire that couples the microcomputer chip and the memory chip to the testing conductive pad is reduced in length. Further, the wire that couples the microcomputer chip and the memory chip to the testing conductive pad is coupled to a pad in the outer row among conductive pads in two rows to be coupled to the microcomputer chip.

6 Claims, 14 Drawing Sheets

(56) References Cited

U.S. PATENT DOCUMENTS

| | | |
|---|---|---|
| 2003/0102547 A1 | 6/2003 | Higashi et al. |
| 2004/0257103 A1* | 12/2004 | Park et al. .................... 324/765 |
| 2005/0093565 A1 | 5/2005 | Okamoto et al. |
| 2005/0140021 A1 | 6/2005 | Wakisaka et al. |
| 2005/0151267 A1* | 7/2005 | Shirakawa et al. ........... 257/777 |
| 2005/0225955 A1 | 10/2005 | Grebenkemper et al. |
| 2007/0096287 A1 | 5/2007 | Araki et al. |
| 2007/0096334 A1 | 5/2007 | Kawabata et al. |
| 2007/0120258 A1 | 5/2007 | Hayashi et al. |
| 2008/0185708 A1 | 8/2008 | Chen et al. |

FOREIGN PATENT DOCUMENTS

| | | |
|---|---|---|
| JP | 2003-68806 A | 3/2003 |
| JP | 2005-322861 A | 11/2005 |
| JP | 2006-086360 A | 3/2006 |
| JP | 2007-123454 | 5/2007 |
| JP | 2007-123466 A | 5/2007 |

* cited by examiner

SEMICONDUCTOR DEVICE WITH WIRING SUBSTRATE INCLUDING LOWER CONDUCTIVE PADS AND TESTING CONDUCTIVE PADS

CROSS-REFERENCE TO RELATED APPLICATION

The present application is a continuation of U.S. patent application Ser. No. 12/203,972, filed Sep. 4, 2008, which claims priority from Japanese patent application No. 2007-236594 filed on Sep. 12, 2007, the content of which is hereby incorporated by reference into this application.

BACKGROUND OF THE INVENTION

The present invention relates to a semiconductor device and more particularly to a technique which is useful for the semiconductor device having a package on package (POP) structure in which a plurality of semiconductor packages are stacked in a multistage manner.

As an aspect of a semiconductor package, a system in package (SIP) is known, in which a system is configured by mounting a plurality of semiconductor chips of different kinds (for example, a microcomputer chip and a memory chip) on a single wiring substrate.

As an example of the SIP of this kind, there is a multi chip module (MCM) described in Japanese patent laid-open No. 10-12809 (Patent Document 1). The MCM includes a multilayer wiring substrate having an insulating layer and a wiring layer and on the surface of the multilayer wiring substrate, a plurality of chips are mounted using a flip-chip method.

On the backside of the multilayer wiring substrate, a plurality of conductive pads for external input/output signals arranged in a grid pattern are formed, and an external input/output signal terminal including a solder ball etc. is coupled onto the pad. Further, on the surface and in the inner layer of the multilayer wiring substrate, signal wirings that couple the terminals of the plurality of chips and the external input/output signal terminals, and signal wirings that couple the terminals of the chips are formed.

Furthermore, within the conductive pad for external input/output signal arranged on the backside of the multilayer wiring substrate, a plurality of conductive terminals for inspection that couple the terminals of the chips and are not coupled to the outside is formed and it is possible to inspect the connection state of all the terminals of the chips and the operation of each chip by applying an inspection probe to the conductive terminal for inspection.

On the other hand, as a semiconductor package in an aspect different from that of the above SIP, there is a package on package (POP) described in Japanese patent laid-open No. 2007-123454 (Patent Document 2). The POP is a lamination package different from the SIP in which a plurality of chips are mounted on a single wiring substrate. In the POP, for example, a package including a wiring substrate mounting a microcomputer chip and a package including a wiring substrate mounting a memory chip are prepared and its system is configured by overlapping the packages to couple their chips to each other.

The POP includes a plurality of wiring substrates, and therefore, even when the number of input/output terminals of the microcomputer chips increases according to the performance level of the system, there is an advantage in that the number of signal wirings can be increased compared to that of the SIP with the same mounting area. In addition, in the POP, because the chips are coupled to each other after the chips are mounted on each wiring substrate, it is possible to determine the connection state of the chip and the wiring substrate prior to the process for coupling the chips to each other, which is effective to improve the yield during package assembly. Further, it is also possible to flexibly cope with a reduction or increase in the kinds of the systems compared to the SIP.

SUMMARY OF THE INVENTION

The present inventors have given consideration to the introduction of a POP, instead of the conventional SIP, in which semiconductor chips to be mounted can be changed in accordance with the use, as in a system for a compact information communication terminal device, such as a mobile phone.

In the POP, a microcomputer chip is mounted on the surface (top surface) of a first wiring substrate having a multilayer wiring layer and a memory chip is mounted on the surface of a second wiring substrate. The microcomputer chip is flip-chip connected (face-down mounted) to the surface (signal pad) of the first wiring substrate via a plurality of solder balls formed along the four sides of its main surface. The memory chip is face-up mounted on the surface of the second wiring substrate and coupled to the signal pad on the surface of the second wiring substrate via a plurality of Au wirings.

Since the microcomputer chip has a number of bonding pads (external connection terminals) far greater than that of the memory chip, the bonding pads (and the solder balls formed on the surface thereof) are arranged in two rows along the four sides of the main surface of the microcomputer chip and the bonding pads in the inner row and the bonding pads in the outer row are arranged in a staggered manner. As a result, the conductive pads formed on the surface of the first wiring substrate are also arranged in two rows and the conductive pads in the inner row and the conductive pads in the outer row are arranged in a staggered manner.

The first wiring substrate on which the microcomputer chip is mounted and the second wiring substrate on which the memory chip is mounted are electrically coupled via a plurality of solder balls formed on the backside of the second wiring substrate. At the center portion of the surface of the first wiring substrate, the microcomputer chip is mounted, and therefore, the solder balls are arranged along the outer edge portion of the backside of the second wiring substrate. On the outer edge portion (outside the microcomputer chip) of the surface of the first wiring substrate, conductive pads to which the solder balls are coupled are formed.

On the backside of the first wiring substrate, a plurality of conductive pads for external input/output signal arranged in a grid pattern is formed, as with the SIP in Patent Document 1 described above, and onto the conductive pads, the solder balls are coupled. The signal pads on the surface of the first wiring substrate and the pad for external input/output signal on the backside are electrically coupled via the signal wire on the substrate surface, the signal wire in the inner layer, and the via hole connecting them.

For the POP configured as described above, a test process for confirming the conduction state of the microcomputer chip and the memory chip is necessary after the first wiring substrate and the second wiring substrate are coupled. This test is conducted by forming a testing conductive pad coupled to the microcomputer chip and the memory chip on the backside of the first wiring substrate and inspecting the conduction state between the chips with a probe applied to the testing conductive pad.

It is preferable to arrange the above-mentioned testing conductive pad inside the conductive pads for external input/ output signals as in the SIP in Patent Document 1 described above in consideration of the compatibility with the motherboard on which the conventional SIP is mounted and the increase in the number of wiring layers of the first wiring substrate.

However, in the case of the POP, the first wiring substrate on which the microcomputer chip is mounted and the second wiring substrate on which the memory chip is mounted are electrically coupled via the solder ball arranged at the outer edge portion of the second wiring substrate, and therefore, if the testing conductive pad is arranged inside the conductive pad for external input/output signal, the number of wirings in the first wiring substrate increases when coupling the solder ball and the testing conductive pad. Because of this, the first wiring substrate becomes more likely to warp resulting from the difference in the coefficient of thermal expansion between the wire and the insulating layer, which are the materials of the wiring substrate. If an attempt is made to thicken the insulating layer to provide the wiring substrate with rigidity as a countermeasure against the warp, it becomes difficult to thin the POP and the manufacturing cost of the wiring substrate increases.

In addition, accompanying the miniaturization and high-performance of the POP, the number of externally connected terminals of the microcomputer chip increases and at the same time, the reduction in pitch of the wire and the conductive pad to be formed on the surface of the first wiring substrate is also promoted, and therefore, if, as described above, the conductive pads on the surface of the first wiring substrate are arranged in two rows and the conductive pads in the inner row and the conductive pads in the outer row are arranged in a staggered pattern, it becomes difficult to route the wire that couples the conductive pad in the outer row and the testing conductive pad through the conductive pads in the inner row.

An object of the present invention is to provide a technique to promote the miniaturization and high-performance of the POP.

Another object of the present invention is to provide a technique to improve the reliability of the POP.

Another object of the present invention is to provide a technique to reduce the manufacturing cost of the POP.

The above and further objects and novel features of the invention will become more fully apparent from the following description in this specification and the accompanying drawings.

Preferred embodiments of the invention which will be disclosed herein are briefly outlined below.

The present invention relates to a semiconductor device having a POP structure in which a first wiring substrate and a second wiring substrate are stacked, the first wiring substrate having a first semiconductor chip with a microcomputer circuit mounted thereon, and the second wiring substrate having a second semiconductor chip with a memory circuit mounted thereon, wherein the first wiring substrate is arranged so that a first surface having the first semiconductor chip mounted thereon opposes one surface of the second wiring substrate and is electrically coupled with the second wiring substrate via a plurality of first conductive pads formed outside a region in which the first semiconductor chip is mounted in the first surface; wherein on a second surface different from the first surface of the first wiring substrate, there are formed a plurality of second conductive pads constituting external input/output terminals and a plurality of testing conductive pads for determining the quality of conduction state of the first semiconductor chip and the second semiconductor chip; and wherein the testing conductive pads are arranged outside the second conductive pads in the second surface.

The effects brought about by the preferred embodiments of the invention are briefly described as follows.

It is possible to promote the miniaturization and high-performance of the POP. In addition, it is possible to improve the reliability of the POP.

DETAILED DESCRIPTION OF THE PREFERRED EMBODIMENTS

Embodiments of the present invention will be described below in detail based on the drawings. In all of the drawings for use in description of the embodiment, the same members are assigned the same symbols and its repeated description is omitted.

First Embodiment

A semiconductor device in the present embodiment is a package on package (POP) to be mounted on a compact information communication terminal, such as a mobile phone.

First, a general configuration of a POP in the present embodiment will be described using FIG. 1 (cross sectional view). A POP 1A is a two-layer structured package of lamination type formed by laminating a memory substrate (second wiring substrate) 5 on which a second semiconductor chip 4 is mounted over a base substrate (first wiring substrate) 3 on which a first semiconductor chip 2 is mounted. Here, the first semiconductor chip 2 is formed by integrating, for example, a programmable logic circuit and a microcomputer circuit into one chip and referred to as a microcomputer chip in the following description. In the second semiconductor chip 4, for example, a DRAM (Dynamic Random Access Memory) circuit having a storage capacity of 512 megabits or 1 gigabit is formed, and is referred to as a memory chip in the following description.

Figure 1:
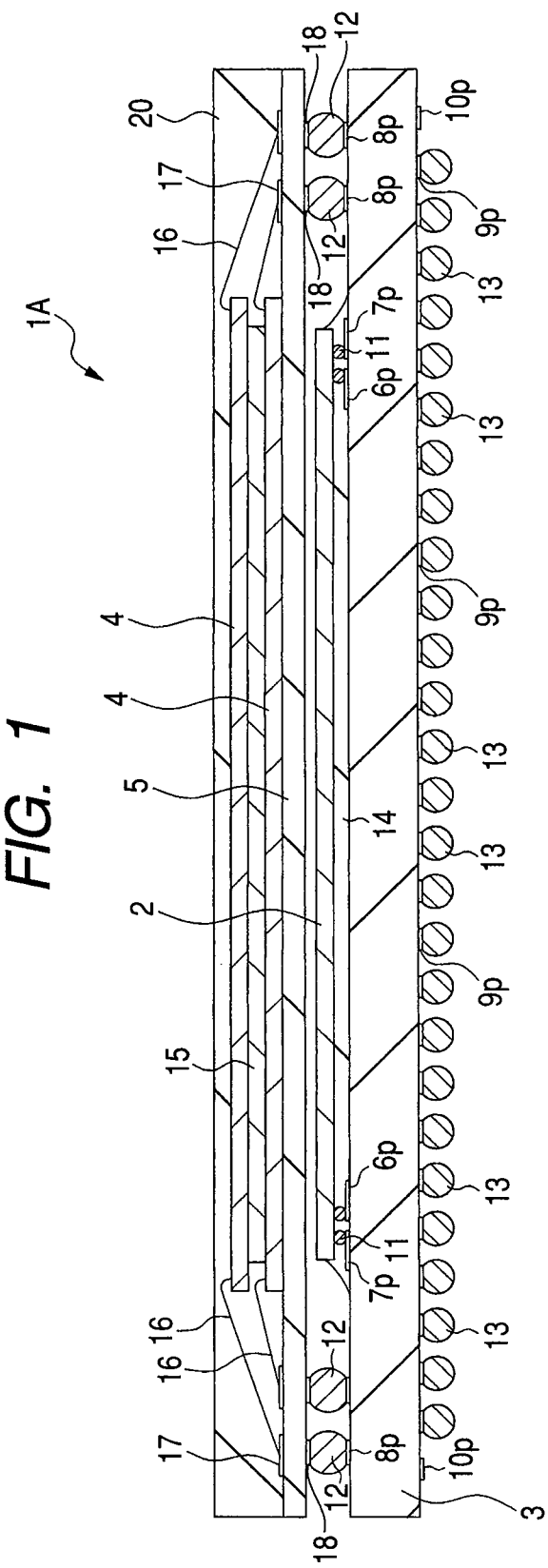
FIG. 1 is a cross sectional view showing a general configuration of a POP in an embodiment of the present invention.

For the POP 1A shown in FIG. 1, a storage capacity of 1.5 gigabits is realized by laminating the two memory chips 4 over the surface (top surface) of the memory substrate 5, however, the storage capacity and the number of the memory chips 4 to be mounted over the memory substrate 5 can be changed accordingly. That is, with the POP 1A, various kinds of semiconductor device can be manufactured with almost no modifications of the specifications on the side of the base substrate 3 over which the microcomputer chip 2 is mounted by changing the storage capacity and the number of the memory chip 4 to be mounted over the memory substrate 5.

The base substrate 3 is a multilayer wiring substrate having wirings in six layers (surface wiring, backside wiring, and inner layer wirings in four layers) manufactured by, for example, a build-up construction method, and an insulating layer that electrically insulates wiring layers includes the prepreg in which resin is impregnated in glass fibers or carbon fibers. The wirings in the six layers include a conductive film containing, for example, copper (Cu) as its principal component. In FIG. 1, these wirings are not shown but only conductive pads 6p, 7p, 8p formed on the surface (top surface) of the base substrate 3, and pads 9p for external input/output and testing conductive pads 10p formed on the backside of the base substrate 3 are shown.

The microcomputer chip 2 is flip-chip connected (face-down connected) to the conductive pads (third conductive pads) 6p, 7p on the surface of the base substrate 3 via a plurality of solder balls 11 formed on its main surface (undersurface). The main surface of the microcomputer chip 2 is hermetically sealed by under-fill resin 14. Although not shown schematically, the microcomputer chip 2 has a large number of bonding pads (input/output terminals), and therefore, the bonding pads (and the solder balls 11 connected to their surfaces) are arranged in two rows along the four sides of the main surface of the microcomputer chip 2 and also the bonding pads in the inner row and the bonding pads in the outer row are arranged in a staggered manner.

On the backside of the base substrate 3, a plurality of the conductive pads (second conductive pads) 9p for external input/output are formed and solder balls 13 are electrically coupled to their surfaces. The POP 1A is mounted on the motherboard of an information communication terminal via the solder balls 13. Although not shown schematically, the wirings on the surface of the base substrate 3 and the conductive pads 9p for external input/output on the backside are electrically coupled via the inner layer wirings and via holes that couple those wirings.

On the outside of the conductive pads 9p for external input/output, a plurality of the testing conductive pads 10p are formed. The testing conductive pads 10p are terminals to be used to determine the quality of the conduction state of the microcomputer chip 2 and the memory 4 after the assembly of the POP 1A is completed. That is, a manufacturing maker of the POP 1A confirms the conduction state of the microcomputer 2 and the memory chip 4 by applying a probe to the testing conductive pad 10p prior to the shipment of the POP 1A for which the assembling has been completed to users (manufacturing makers of information communication terminal devices etc.). As a result, when a user installs the POP 1A on the motherboard of an information communication terminal device, it is not necessary to connect the testing conductive pads 10p to the motherboard, and therefore, the solder ball 13 is not connected to the testing conductive pads 10p.

On the other hand, the memory substrate 5 over which the two memory chips 4 are mounted composes a resin substrate having a glass epoxy resin etc. as an insulating layer. One of the two memory chips 4 is face-up mounted over the surface of the memory substrate 5 and the other is stacked on the memory chip 4 via a dummy chip 15. Each of the two memory chips 4 is electrically coupled to a conductive pad 17 on the surface of the memory chip 4 via an Au wire 16. The two memory chips 4, the dummy chip 15, the Au wire 16, and the conductive pad 17 are hermetically sealed by mold resin 20. On the backside of the memory substrate 5, a conductive pad 18 is formed, which is electrically coupled to the conductive pad 17 by a via hole, not shown schematically, and to its surface, a solder ball 12 is electrically coupled. Each of the conductive pads 17, 18 is, for example, arranged in two rows along the outer edge portion of the memory substrate 5.

The solder ball 12 coupled to the conductive pad 18 of the memory substrate 5 is electrically coupled also to the conductive pad (first conductive pad) 8p formed at the outer edge portion of the surface of the base substrate 3 and due to this, the base substrate 3 over which the microcomputer 2 is mounted and the memory substrate 5 over which the memory chip 4 is mounted are electrically coupled. The solder ball 12 has a diameter greater than the sum of the diameter of the solder ball 11 formed over the main surface of the microcomputer chip 2 and the thickness of the microcomputer chip 2 so that the top surface of the microcomputer chip 2 mounted over the base substrate 3 does not come into contact with the undersurface of the memory substrate 5.

Figure 2:
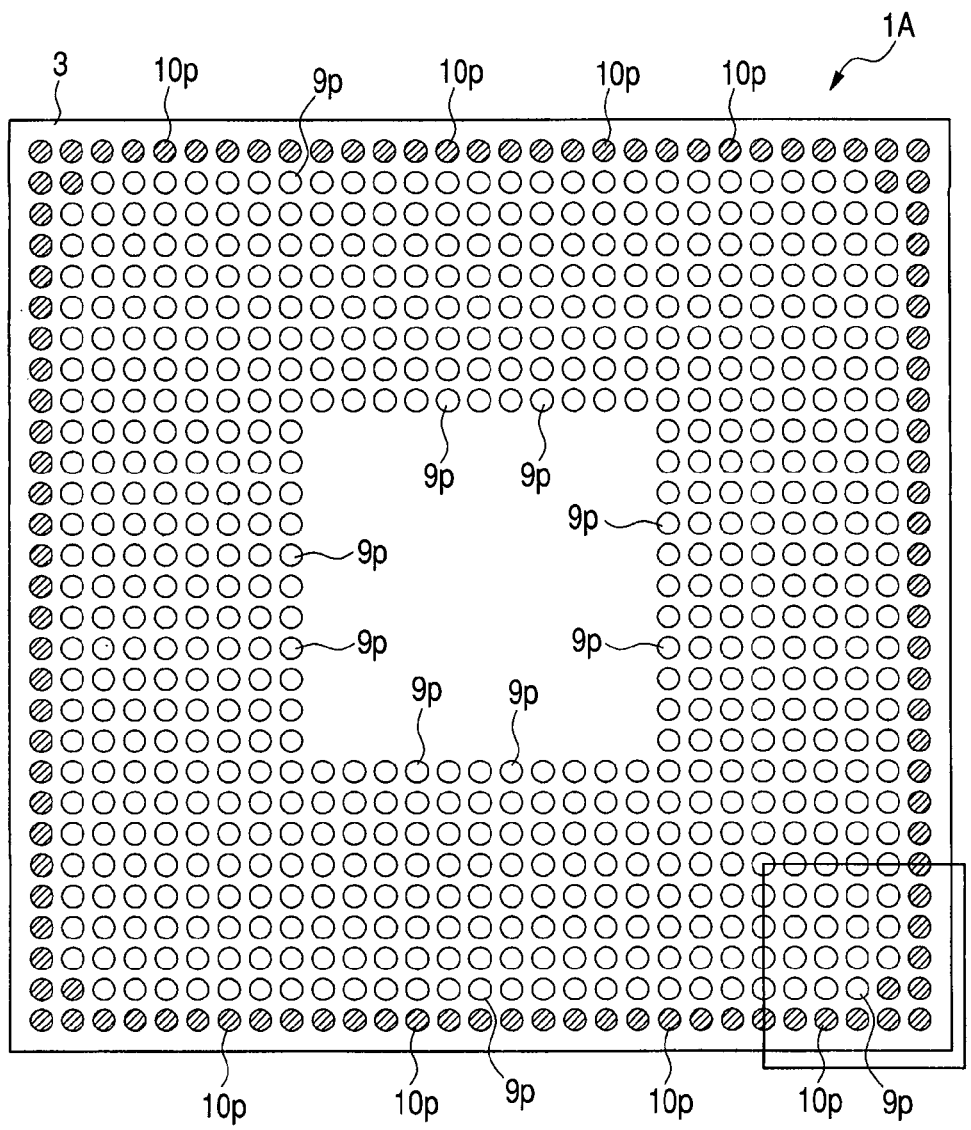
FIG. 2 is a plan view showing the backside of a base substrate constituting part of the POP.
Figure 3:
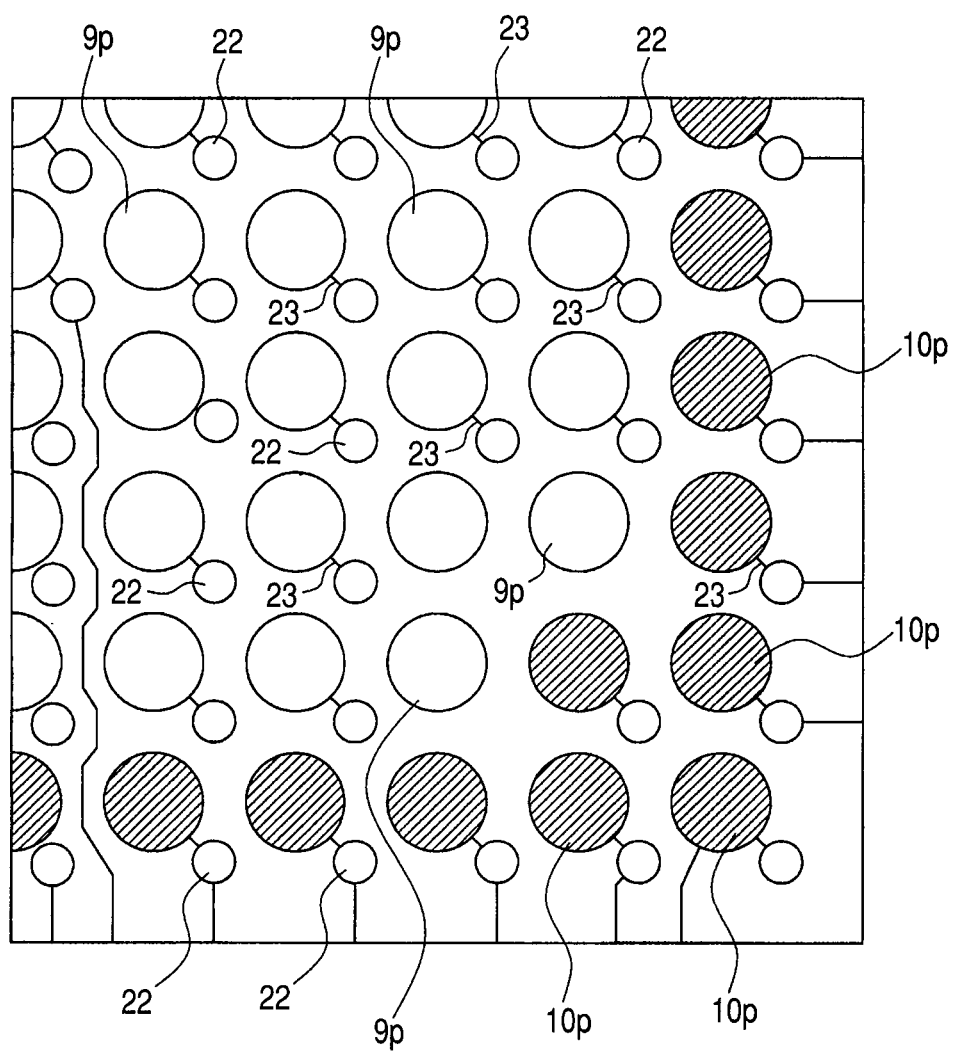
FIG. 3 is an enlarged plan view showing part of FIG. 2.

As described above, on the backside of the base substrate 3, the conductive pad 9p for external input/output and the testing conductive pads 10p are formed. FIG. 2 is a plan view showing the backside of the base substrate 3 and FIG. 3 is an enlarged plan view of part (region surrounded by a rectangular frame) of FIG. 2. In FIG. 2 and FIG. 3, the solder ball 13 coupled to the conductive pad 9p for external input/output is not shown schematically.

As shown in FIG. 2, the conductive pads 9p for external input/output are arranged in a grid pattern on the backside of the base substrate 3. On the outside of the conductive pads 9p for external input/output, the testing conductive pads 10 (shown hatched) are arranged. As shown in FIG. 3, in the vicinity of the conductive pads 9p for external input/output, a via hole 22 is formed and the conductive pad 9p for external input/output and the via hole in its vicinity are electrically coupled by a backside wiring (sixth layer wire) 23. The conductive pad 9p for external input/output is electrically coupled to the inner layer wiring (not shown) via the via hole 22 and the backside wiring 23. Also in each vicinity of the testing conductive pads 10p, the via hole 22 is formed and the testing conductive pad 10p and the via hole 22 in its vicinity are electrically coupled by the backside wiring 23. The testing conductive pad 10p is electrically coupled to the inner layer wiring, to be described later, by the via hole 22 and the backside wiring 23.

Figure 4:
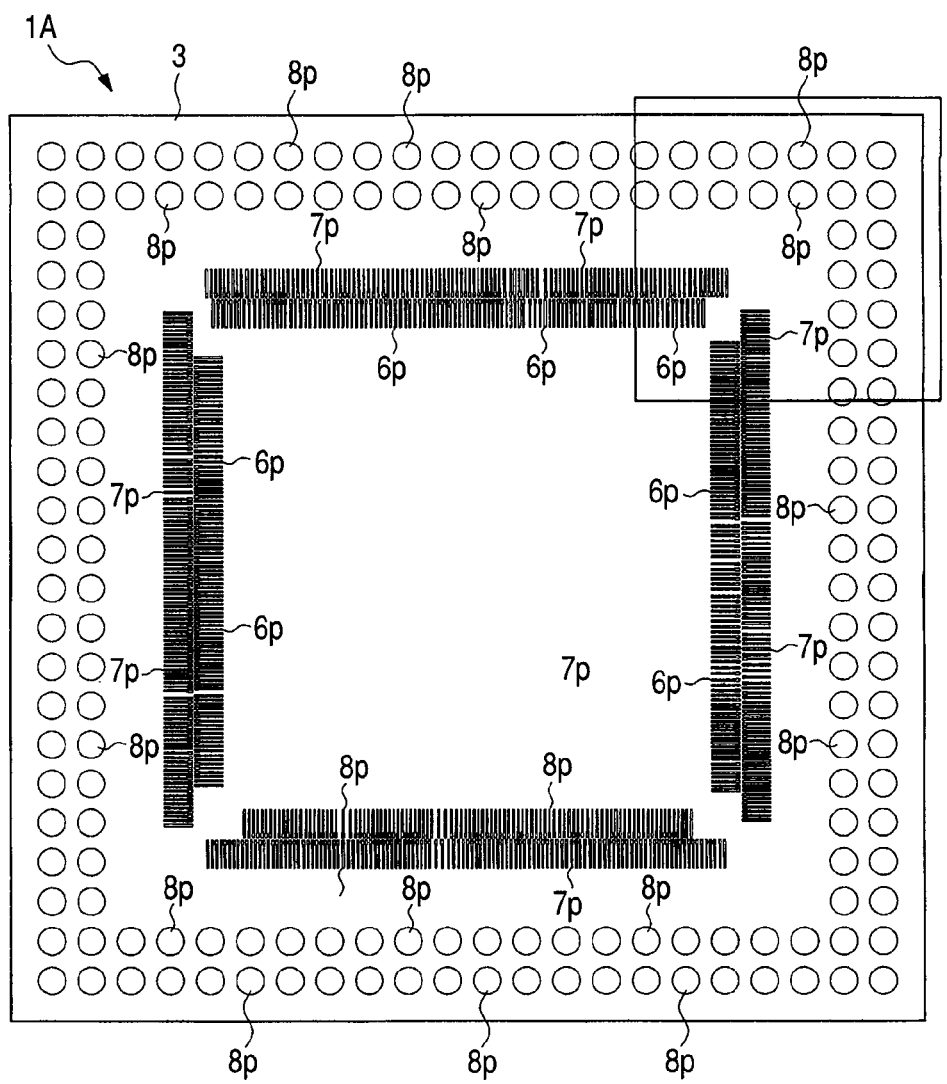
FIG. 4 is a plan view showing a layout of conductive pads formed on the surface of the base substrate constituting part of the POP.
Figure 5:
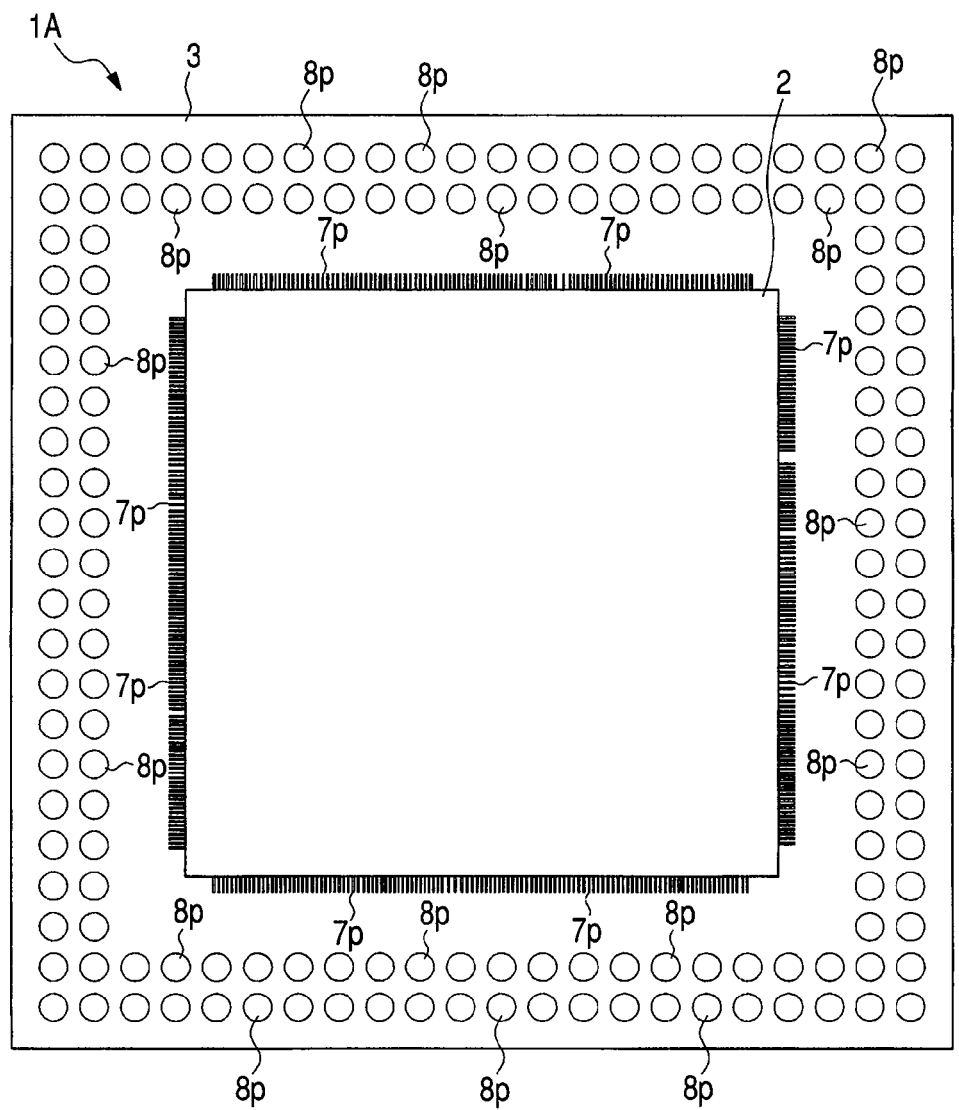
FIG. 5 is a plan view showing a state where a microcomputer chip is mounted on the surface of the base substrate constituting part of the POP.
Figure 6:
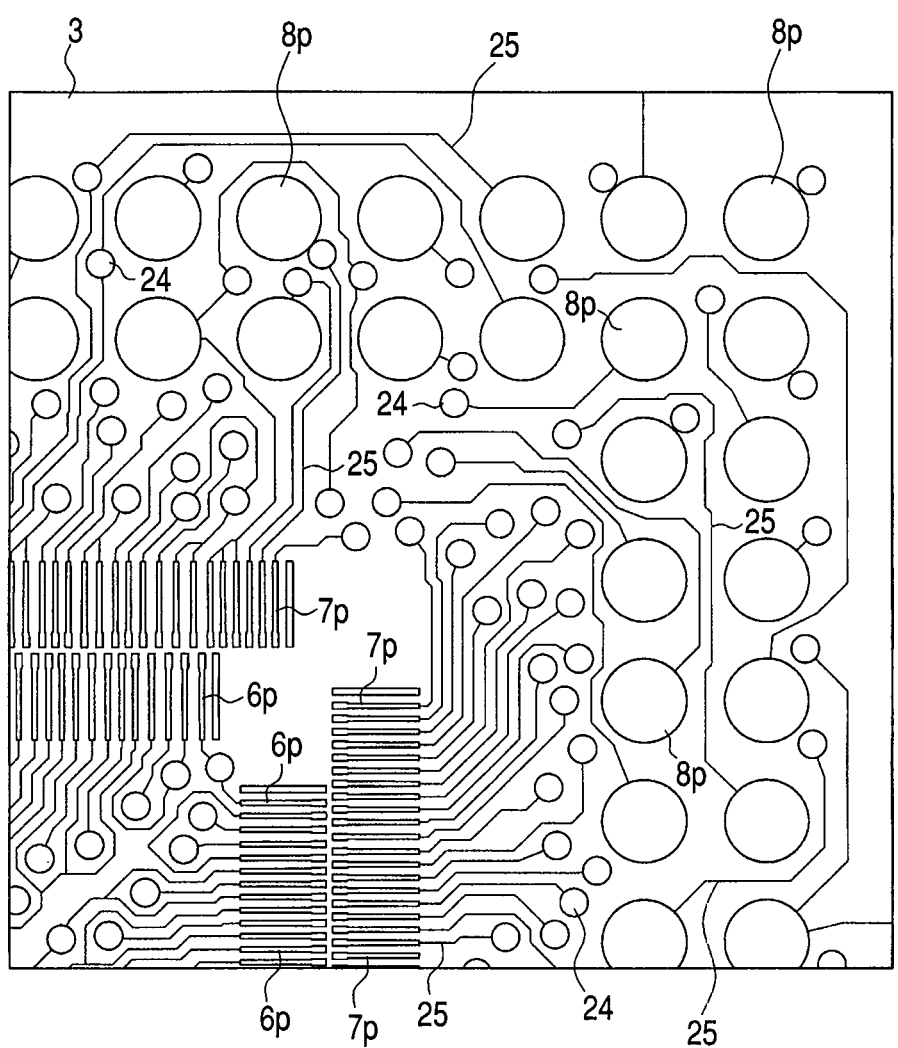
FIG. 6 is an enlarged plan view showing part of FIG. 4.

FIG. 4 is a plan view showing a layout of the conductive pads 6p, 7p, 8p formed over the surface of the base substrate 3, FIG. 5 is plan view showing a state where the microcomputer chip 2 is mounted over the surface of the base substrate 3, and FIG. 6 is an enlarged plan view of part (region surrounded by a rectangular frame) of FIG. 4.

As described above, the bonding pads of the microcomputer chip 2 are arranged in two rows along the four sides of the main surface of the microcomputer chip 2 and the bonding pads in the inner row and the bonding pads in the outer row are arranged in a staggered manner. Because of this, as shown in FIG. 4 and FIG. 6, the conductive pads 6p, 7p of the base substrate 3 on which the solder balls 11 coupled to the bonding pads of the microcomputer chip 2 are also arranged in two rows along the directions parallel to the four sides of the base substrate 3 and the conductive pads 6p in the inner row and the conductive pads 7p in the outer row are arranged in a staggered manner. In addition, as shown in FIG. 6, each of the conductive pads 6p, 7p, 8p are coupled to the inner layer wiring (not shown) via a surface wiring (first layer wiring) 25 and a via hole 24. In FIG. 4 and FIG. 5, the surface wiring 25 and the via hole 24 are not shown schematically in order to avoid complicating the drawings.

Figure 7:
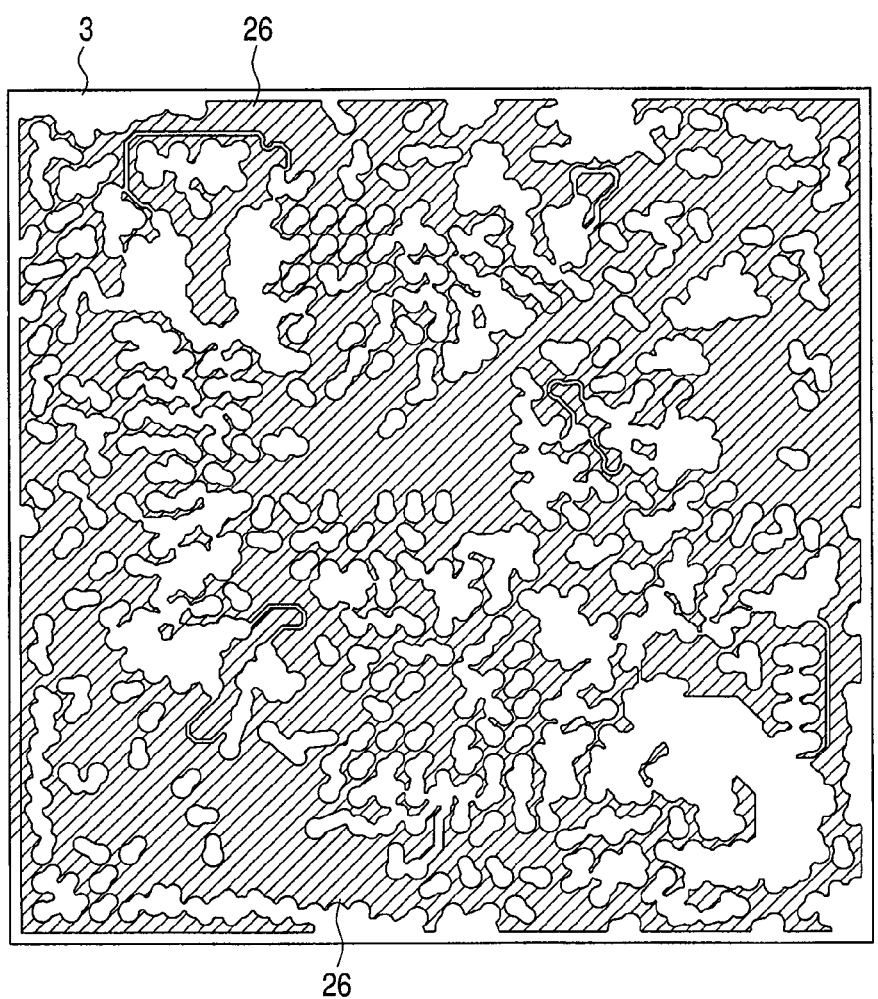
FIG. 7 is a plan view showing a GND plane layer formed in the inner layer of the base substrate constituting part of the POP.
Figure 8:
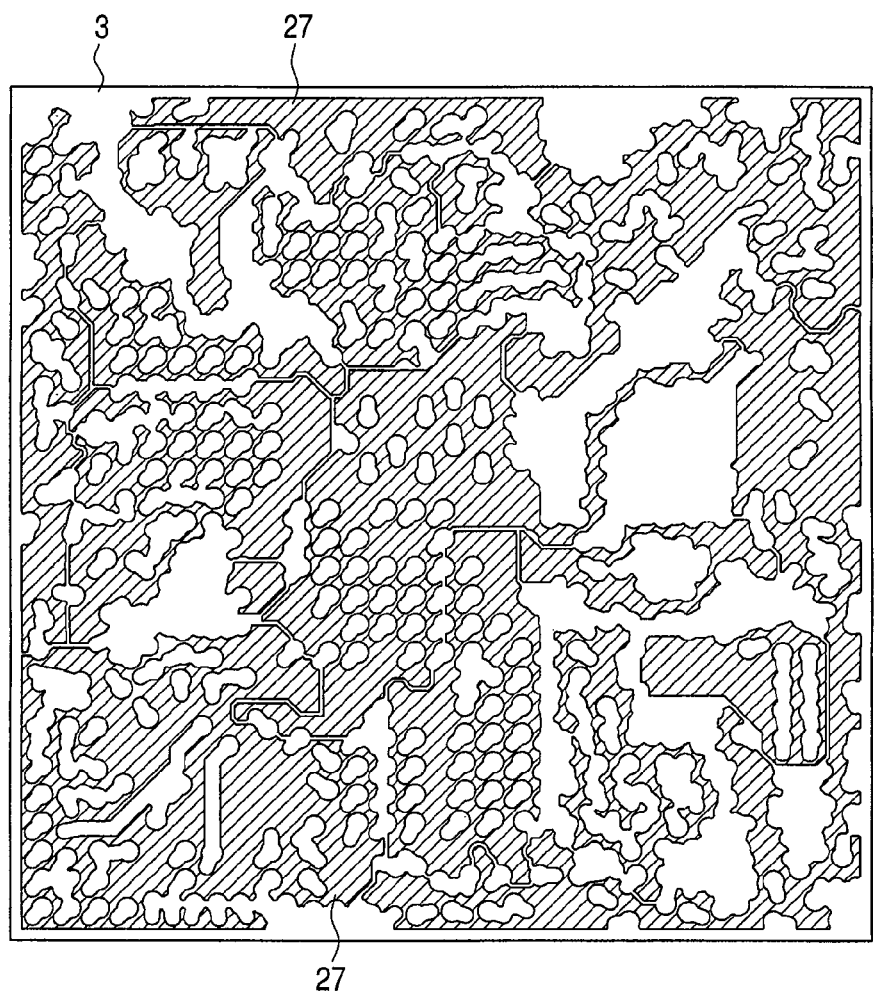
FIG. 8 is a plan view showing a power supply plane layer formed in the inner layer of the base substrate constituting part of the POP.

FIG. 7 is a plan view showing a GND plane layer 26 formed in the inner layer (wiring layer in the third layer) of the base substrate 3 and FIG. 8 is a plan view showing a power supply plane layer 27 formed in the wiring layer in the fourth layer.

The GND plane layer 26 is formed so that it covers substantially the entire surface of the wiring layer in the third layer except for the region where the via holes (not shown) that connect wirings in the upper and lower layers are formed in order to stabilize the power supply provided to the POP 1A. For the same reason, the power supply plane layer 27 is also formed so that it covers substantially the entire surface of the wiring layer in the fourth layer except for the region where the via holes (not shown) that connect wirings in the upper and lower layers.

Figure 9:
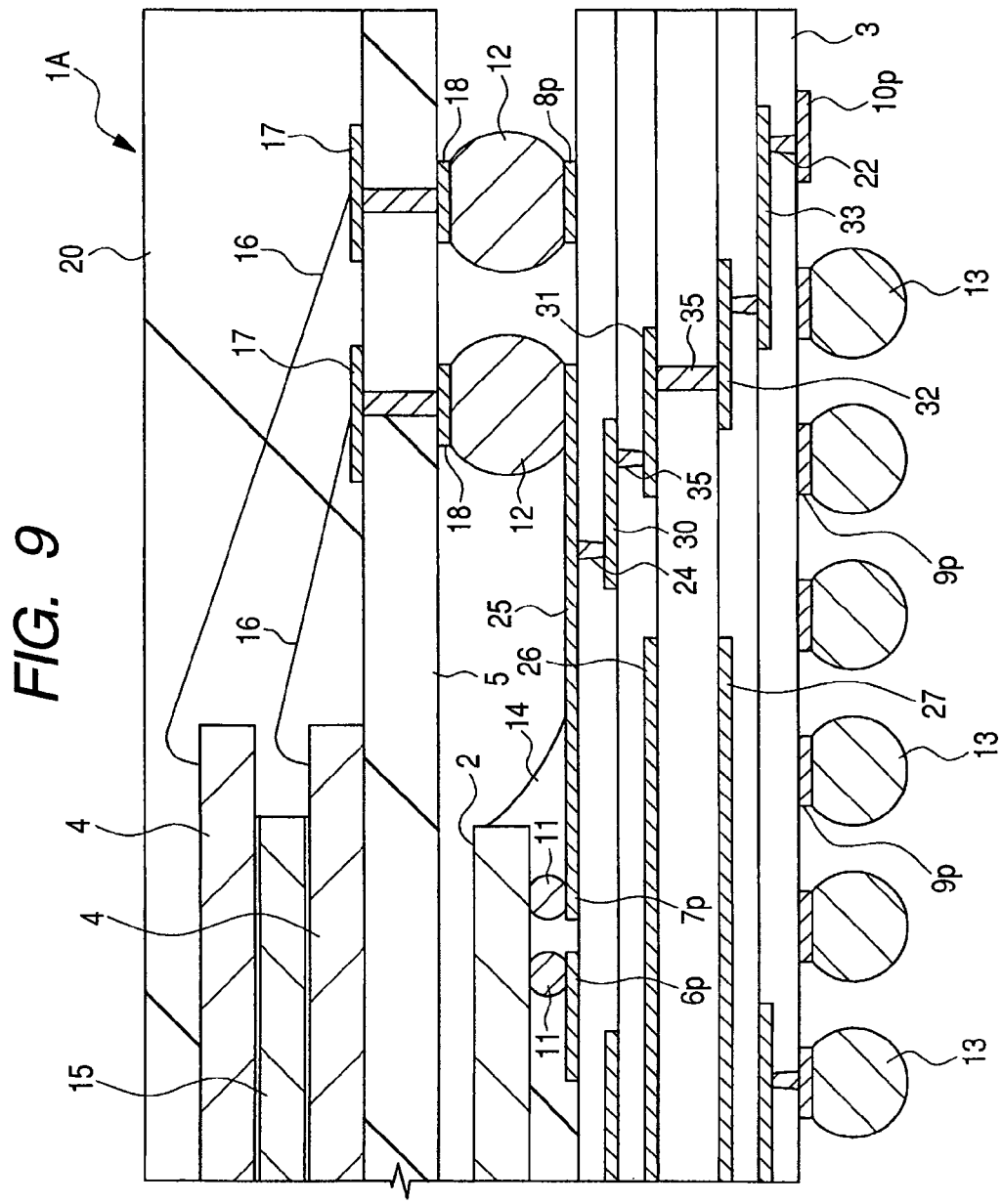
FIG. 9 is a cross sectional view of essential parts showing an example of the route of a wire that connects the microcomputer chip and the memory chip mounted on the POP to a testing conductive pad.

FIG. 9 is a cross sectional view of essential parts showing an example of the route of a wiring that connects the microcomputer chip 2 and the memory chip 4 to the testing conductive pad 10p. As shown in FIG. 9, when coupling the microcomputer chip 2 and the memory chip 4 to the testing conductive pad 10p via the wiring layer formed on the base substrate 3, the microcomputer chip 2 and the memory chip 4 are electrically coupled via the conductive pad 7p in the outer row as a general rule. The reason is that, in the case of the POP structure, as described above, the conductive pad (first conductive pad) 8p for the conduction between the solder ball 12 coupled to the conductive pad 18 of the memory substrate 5 and the base substrate 3 is located outside (outer edge portion of the base substrate) the conductive pads 6p, 7p that electrically couple with the microcomputer chip 2. In addition, accompanying the reduction in size of the semiconductor device, the pitches of the conductive pads 6p, 7p reduce, and therefore, it becomes difficult to route the wiring between the conductive pads.

Figure 10:
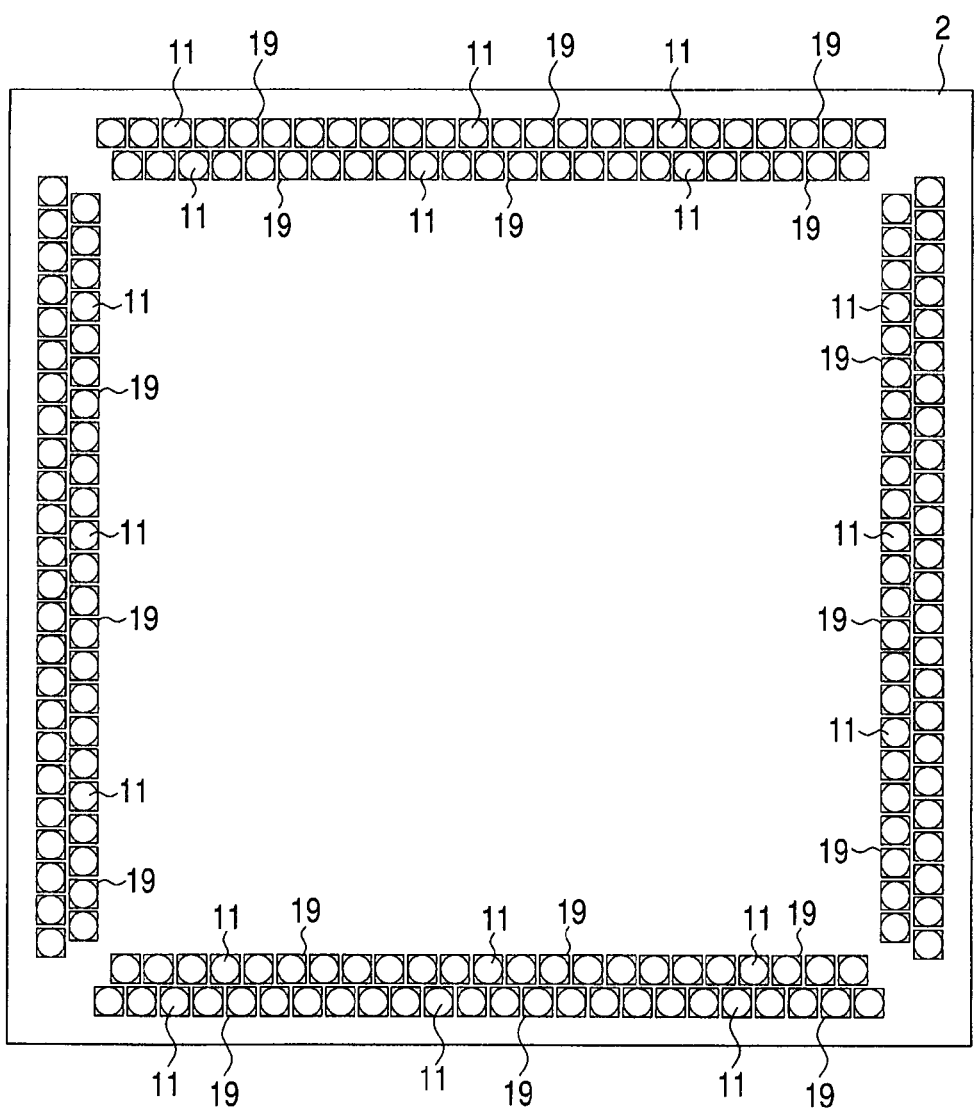
FIG. 10 is a plan view showing the main surface of the microcomputer chip mounted on the POP.

Because of this, as shown in FIG. 10, similarly on the microcomputer chip 2, among a plurality of the conductive pads (electrodes) 19 formed on the main surface of the microcomputer chip 2, the conductive pad 19 to be coupled to the testing conductive pad 10p is arranged in the outer (outer edge portion of the microcomputer chip 2) row as a general rule. In the example shown in FIG. 9, the microcomputer chip 2 and the memory chip 4 are electrically coupled via the surface wiring 25 integrally formed with the conductive pad 7p in the outer row. In addition, the surface wiring 25 is electrically coupled to the testing conductive pad 10p via a second layer wiring 30, a third layer wiring 31, a fourth layer wiring 32, and a fifth layer wiring 33 formed in the vicinity of the outer edge of the base substrate 3, and the via holes 22, 24 and a via hole 35 that electrically couple these wirings.

Figure 11:
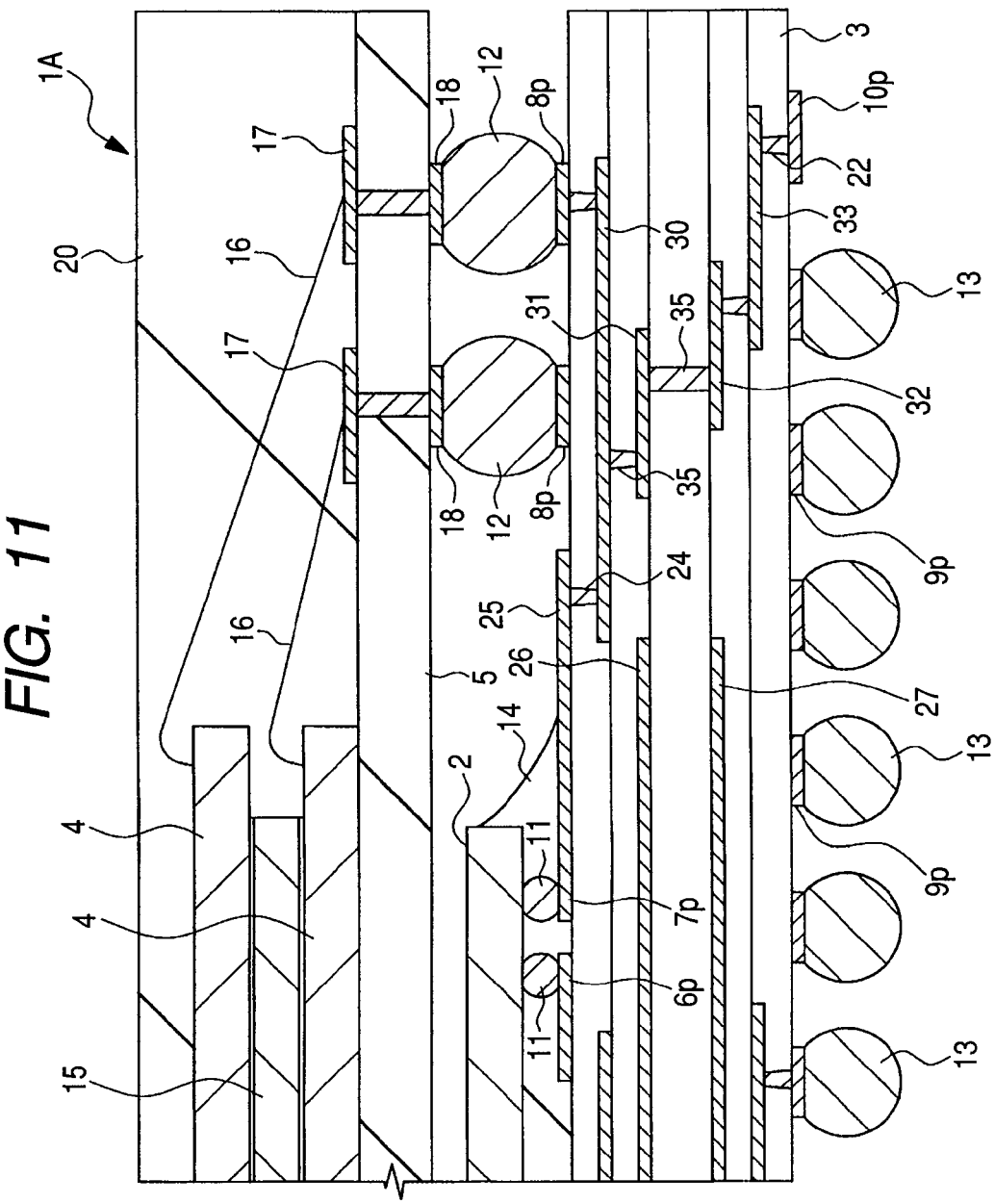
FIG. 11 is a cross sectional view of essential parts showing another example of the route of a wire that connects the microcomputer chip and the memory chip mounted on the POP to the testing conductive pad.

Further, in the example shown in FIG. 11, the microcomputer chip 2 and the memory chip 4 are electrically coupled via the surface wiring 25 formed integrally with the conductive pad 7p in the outer row, the via hole 24, and the second layer wiring 30. The second layer wiring 30 is electrically coupled to the testing conductive pad 10p via the third layer wiring 31, the fourth layer wiring 32, and the fifth layer wiring 33 formed in the vicinity of the outer edge of the base substrate 3, and the via holes 22, 24, 35 that electrically couple those wirings.

Figure 12:
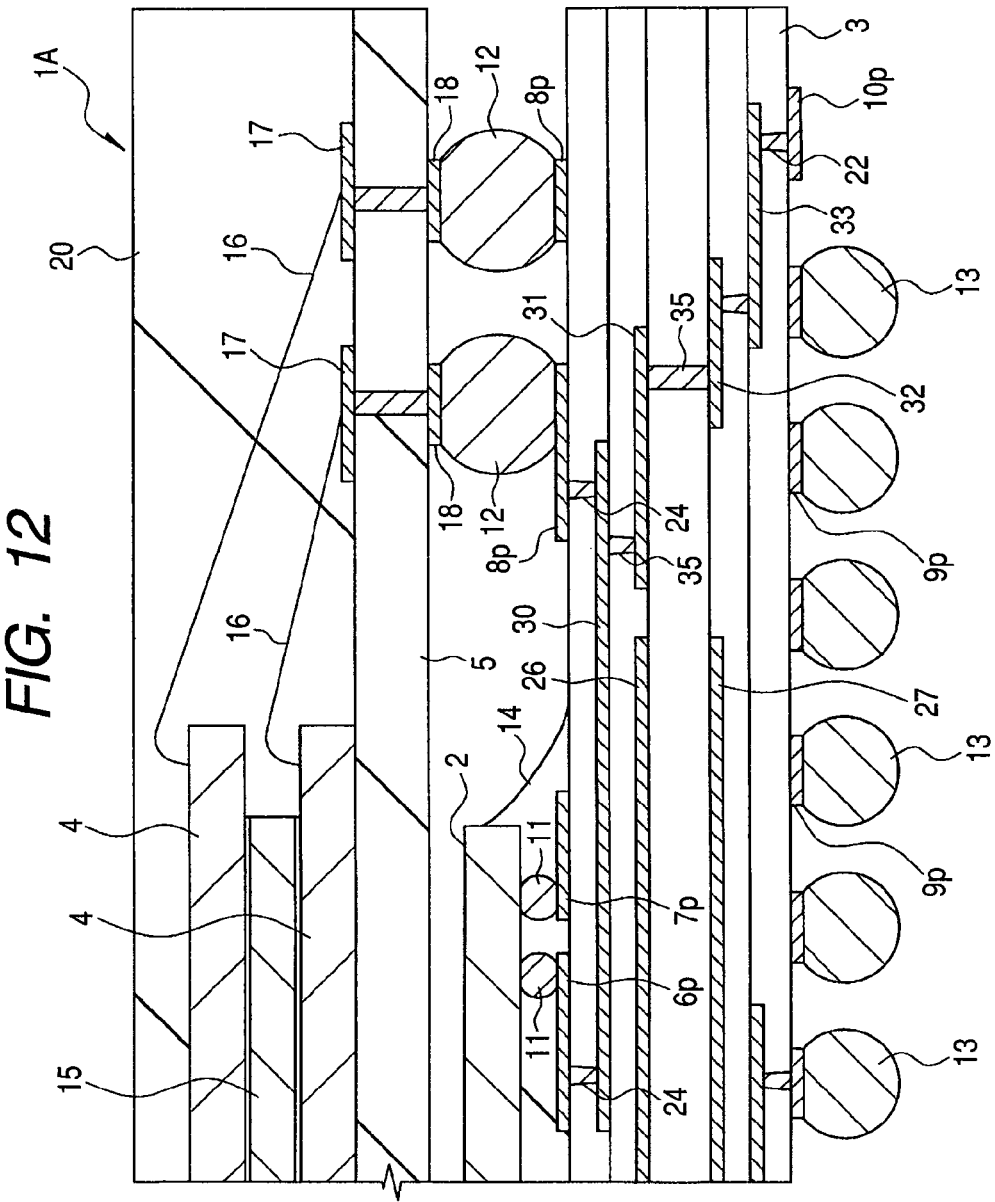
FIG. 12 is a cross sectional view of essential parts showing another example of the route of a wire that connects the microcomputer chip and the memory chip mounted on the POP to the testing conductive pad.

Because of the restriction of the wiring design rules, if there is a portion where the microcomputer chip 2 and the memory chip 4 cannot be coupled electrically via the conductive pad 7p in the outer row, or if, because of the restriction of the design rules of the microcomputer chip 2, it is not possible to arrange the pad (first pad) to be coupled electrically with the testing conductive pad 10p to the pad (electrode) 7p in the outer row, the microcomputer chip 2 and the memory chip 4 are electrically coupled via the conductive pad 6p in the inner row. For example, in the example shown in FIG. 12, the microcomputer chip 2 and the memory chip 4 are electrically coupled via the conductive pad 6p in the inner row, the via hole 24, and the second layer wiring 30 that extends inwardly beyond the conductive pad 7p in the outer row. The second layer wiring 30 is electrically coupled to the testing conductive pad 10p via the third layer wiring 31, the fourth layer wiring 32, and the fifth layer wiring 33 formed in the vicinity of the outer edge of the base substrate 3, and the via holes 22, 24, 35 that electrically couple these wirings.

As described above, in the POP 1A in the present embodiment, the testing conductive pad 10p for determining the quality of the conduction state of the microcomputer chip 2 and the memory chip 4 is arranged outside the conductive pad 9p for external input/output. Then, when electrically coupling the microcomputer chip 2 and the memory chip 4 to the testing conductive pad 10p, the conduction pad 7p in the outer row is used, as a general rule, and only when the conduction pad 7p in the outer row cannot be used because of the restriction of the wiring design rules, the conduction pad 6p in the inner row is used.

By doing so, it is possible to shorten the wiring route from the solder ball 12 to the testing conductive pad 10p compared to the case where the testing conductive pad 10p is arranged inside the conductive pad 9p for external input/output. As a result, the number of wirings formed on the base substrate 3 is reduced, and therefore, it is possible to suppress warping of the base substrate 3 resulting from the difference between the coefficient of thermal expansion of the wiring and the insulating layer (prepreg). Since the number of wirings formed on the base substrate 3, that is, the length of the wiring, is reduced, improvements in the electrical characteristics, such as noise reduction, can be expected.

Further, by doing so, the via hole 35 that connects the microcomputer chip 2 and the memory chip 4 to the testing conductive pad 10p is arranged, as a result, in the vicinity of the outer edge of the base substrate 3. On the other hand, when the testing conductive pad 10p is arranged inside the conductive pad 9p for external input/output, the via hole that connects the microcomputer chip 2 and the memory chip 4 to the testing conductive pad 10p is arranged inside the base substrate 3. However, when the via hole is arranged inside the base substrate 3, the GND plane layer 26 and the power supply plane layer 27 formed in the inner layer of the base substrate 3 become more likely to be separated by the via hole, and therefore, their area is reduced. In contrast to this, in the case of the POP 1A of the present embodiment, where the via hole 35 that connects the microcomputer chip 2 and the memory chip 4 to the testing conductive pad 10p is arranged in the vicinity of the outer edge of the base substrate 3, the GND plane layer 26 and the power supply plane layer 27 are unlikely to be separated by the via hole 35, and therefore, the area of the GND plane layer 26 and the power supply plane layer 27 increases and it is possible to stabilize the power supply to be provided to the POP 1A.

In addition, by coupling the microcomputer chip 2 and the memory chip 4 to the testing conductive pad 10p using the conductive pad 7p in the outer row, it is made possible to draw out the surface wiring 25 to be coupled to the conductive pad 7p to the outside of the conductive pad 7p and draw out the surface wiring 25 to be coupled to the conductive pad 6p in the inner row to the inside of the conductive pad 6p. Due to this, the surface wiring 25 that runs between the neighboring inner conductive pads 6p, 6p or between the neighboring outer conductive pads 7p, 7p is no longer necessary, and therefore, it becomes easier to narrow the pitch of the conductive pads 6p, 7p.

Further, by making it easier to narrow the pitch of the conductive pads 6p, 7p, the manufacturing cost of the base substrate 3 can be reduced. That is, when fabricating a wiring substrate on which a wire is arranged between the conductive pads 6p, 7p with a narrow pitch, an expensive material for wiring substrate, such as an ABF film, is necessary. However, when no wiring is arranged between the conductive pads 6p, 7p, it is made possible to narrow the pitch of the conductive pads 6p, 7p based on wiring design rules less strict than when a wire is arranged between the conductive pads 6p, 7p, and therefore, it is possible to use a material for the wiring substrate, such as the prepreg, the manufacturing cost of which is lower than that of the ABF film although the machining precision is lower.

When coupling the conductive pad 7p in the outer row to the testing conductive pad 10p, it is recommended to use the conductive pad 7p formed at the corner portion of the base substrate 3 and in the region in the vicinity thereof (for example, the region surrounded by the rectangular frame in FIG. 4) among the conductive pads 7p arranged along the four sides of the base substrate 3.

Second Embodiment

Figure 13:
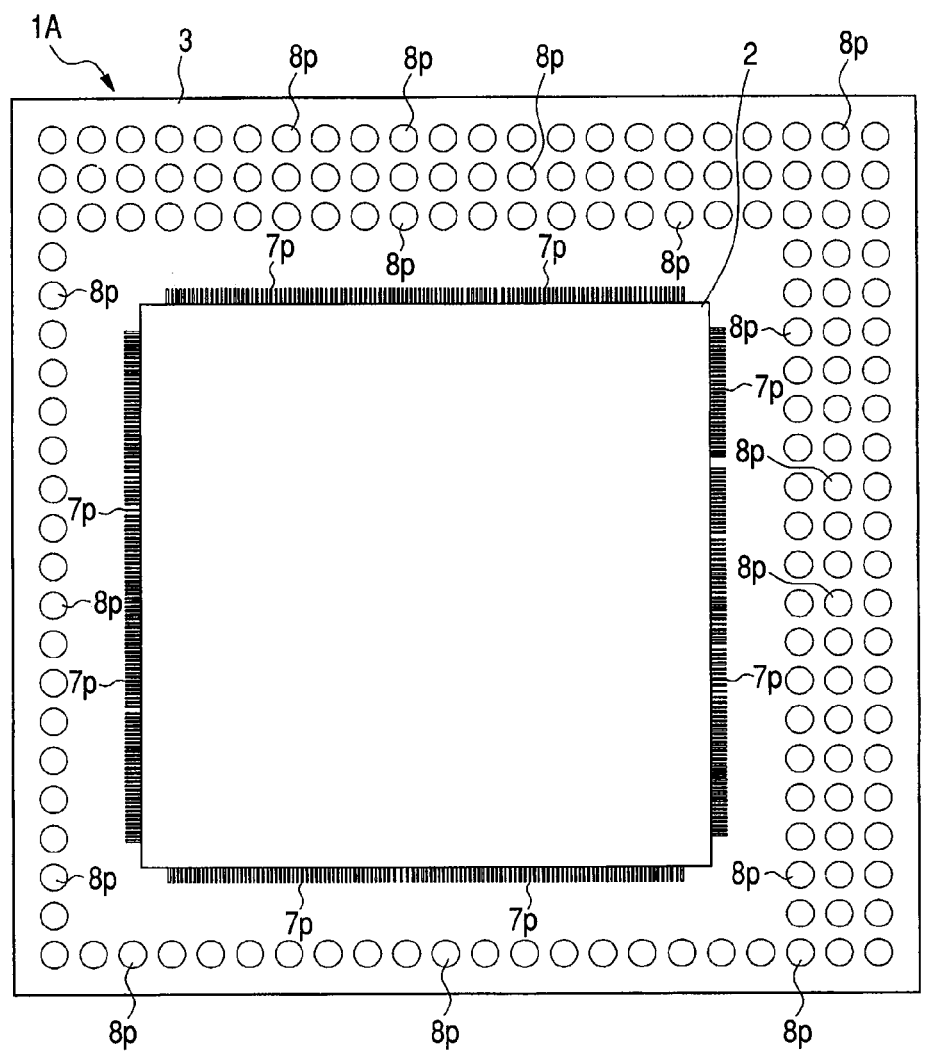
FIG. 13 is a plan view showing a state where the microcomputer chip is mounted on the surface of the base substrate constituting part of the POP.
Figure 14:
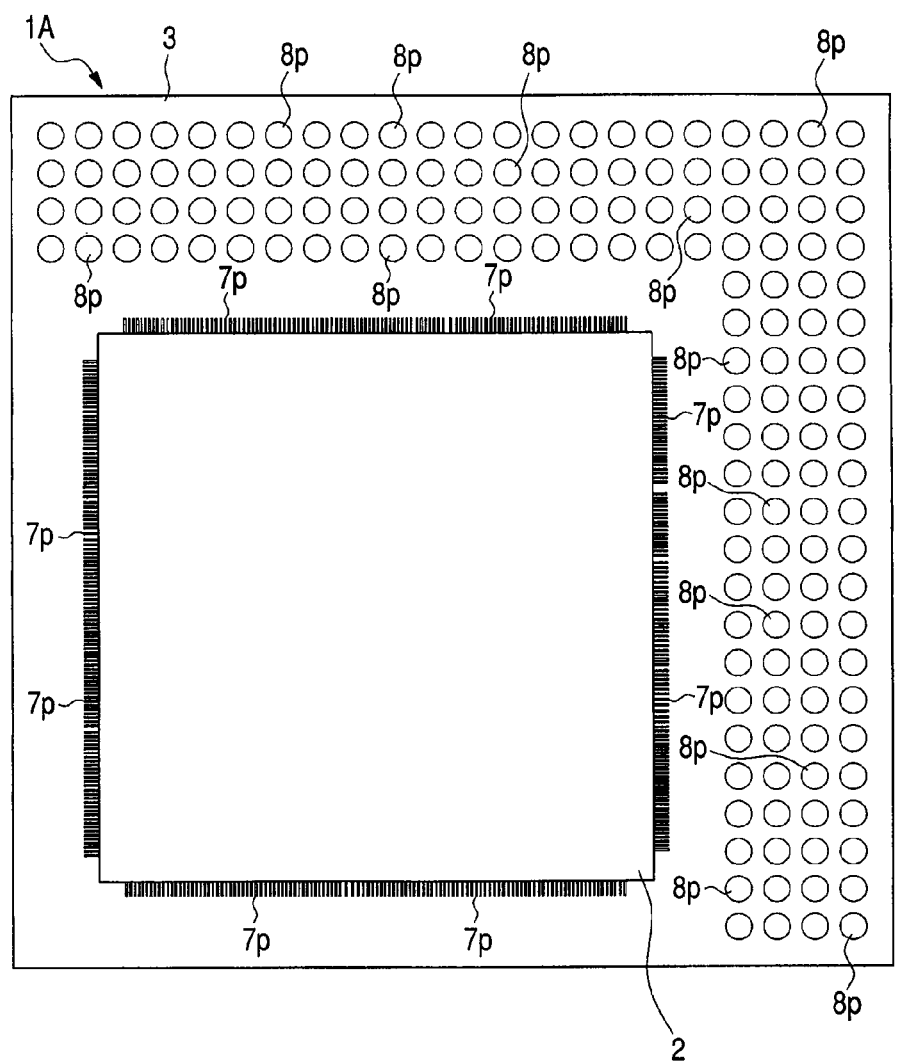
FIG. 14 is a plan view showing a state where the microcomputer chip is mounted on the surface of the base substrate constituting part of the POP.

In the first embodiment described above, the microcomputer chip 2 is mounted at the center of the surface of the base substrate 3, however, the microcomputer chip 2 may be mounted at a position shifted from the center of the surface of the base substrate 3, for example, as shown in FIG. 13 and FIG. 14. In this case also, it is possible to reduce the number of wirings to be formed on the base substrate 3 by arranging the conductive pad 8p in the vicinity of the outer conductive pad 7p to be coupled to the testing conductive pad 10p and also arranging the testing conductive pad 10p outside of the outer conductive pad 7p.

As above, the invention made by the present inventors has been described specifically based on the embodiments, however, it is obvious that the present invention is not limited to the above embodiments but various modifications can be made within the scope thereof while not departing from its concept.

For example, it is also possible to stack a plurality of memory substrates (second wiring substrates) over the base substrate (first wiring substrate). Further, the memory chip (second semiconductor chip) mounted over the memory substrate (second wiring substrate) may be a memory circuit other than DRAM, for example, a memory chip having a flash memory circuit.

Further, the present invention can be effectively applied to a semiconductor device having a package on package (POP) structure in which a plurality of semiconductor packages are stacked in a multistage manner.

What is claimed is:
1. A semiconductor device comprising:
a first wiring substrate including a first upper surface, a plurality of first upper conductive pads formed on the first upper surface, a plurality of second upper conductive pads formed on the first upper surface, a first lower surface opposite to the first upper surface, a plurality of first lower conductive pads formed on the first lower surface, and a plurality of testing conductive pads formed on the first lower surface;
a first semiconductor chip mounted on the first upper surface and electrically connected with the first upper conductive pads;
a second wiring substrate including a second upper surface, a plurality of second upper conductive pads, a second lower surface opposite to the second upper surface, and a plurality of second lower conductive pads, and stacked over the first wiring substrate such that the second lower surface faces the first upper surface;
a second semiconductor chip mounted on the second upper surface; and
a plurality of solder balls formed on the first lower conductive pads, respectively, and not formed on the testing conductive pads, respectively;
wherein the testing conductive pads are electrically connected with both the first and second upper conductive pads, respectively;
wherein the second lower conductive pads are electrically connected with the second upper conductive pads, respectively;
wherein the second upper conductive pads are electrically connected with the second lower conductive pads, respectively;
wherein the second upper conductive pads are arranged around the first semiconductor chip in a plan view;
wherein a shape in a plan view of the first lower surface of the first wiring substrate is comprised of a quadrangle;
wherein the first lower conductive pads are circularly arranged on the basis of a central portion of the first lower surface of the first wiring substrate in the plan view; and
wherein the testing conductive pads are arranged outside the first lower conductive pads in the plan view, and are arranged at corner areas of the first lower surface of the first wiring substrate, respectively.
2. The semiconductor device according to claim 1, wherein, in the plan view, the testing conductive pads are further arranged at sides of the first lower surface of the first wiring substrate, respectively; and
wherein the number of lines of the testing conductive pads arranged at each of the corner areas is larger than that of the testing conductive pads arranged at each of the sides.
3. The semiconductor device according to claim 1, wherein the first wiring substrate is manufactured by a build-up construction method.
4. The semiconductor device according to claim 3, wherein, in each of the corner areas of the first lower surface of the first wiring substrate, the testing conductive pads are arranged in an array in the plan view.
5. The semiconductor device according to claim 1, wherein, in each of the corner areas of the first lower surface of the first wiring substrate wiring substrate, the testing conductive pads are arranged in an array in the plan view.

6. A semiconductor device comprising:
- a first wiring substrate including a first upper surface, a plurality of first upper conductive pads formed on the first upper surface, a first lower surface opposite to the first upper surface, a plurality of first lower conductive pads formed on the first lower surface, and a plurality of testing conductive pads formed on the first lower surface;
- a first semiconductor chip mounted on the first upper surface, the first semiconductor chip having a main surface and a plurality of electrodes electrically connected with the first upper conductive pads;
- a resin sealing the main surface of the first semiconductor chip and in contact with the first upper conductive pads of the first wiring substrate;
- a plurality of solder balls formed on the first lower conductive pads, respectively, and not formed on the testing conductive pads, respectively;
- wherein a shape in a plan view of the first lower surface of the first wiring substrate is comprised of a quadrangle;
- wherein the first lower conductive pads are circularly arranged on the basis of a central portion of the first lower surface of the first wiring substrate in the plan view; and
- wherein the testing conductive pads are arranged outside the first lower conductive pads in the plan view, and are arranged at corner areas of the first lower surface of the first wiring substrate, respectively.

\* \* \* \* \*